US009438191B2

(12) United States Patent
Blednov

(10) Patent No.: US 9,438,191 B2
(45) Date of Patent: Sep. 6, 2016

(54) RADIO FREQUENCY POWER AMPLIFIER CIRCUIT

(71) Applicant: Igor Ivanovich Blednov, Toulouse (FR)

(72) Inventor: Igor Ivanovich Blednov, Toulouse (FR)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/514,556

(22) Filed: Oct. 15, 2014

(65) Prior Publication Data

US 2015/0333706 A1 Nov. 19, 2015

(30) Foreign Application Priority Data

May 15, 2014 (WO) .................. PCT/IB2014/000963

(51) Int. Cl.
| H01B 1/04 | (2006.01) |
| H03F 3/68 | (2006.01) |
| H03F 3/60 | (2006.01) |
| H03F 1/02 | (2006.01) |
| H03F 3/19 | (2006.01) |
| H03F 3/21 | (2006.01) |
| H04B 1/04 | (2006.01) |
| H03F 3/195 | (2006.01) |
| H03F 3/24 | (2006.01) |
| H04W 88/08 | (2009.01) |

(52) U.S. Cl.
CPC .......... H03F 3/602 (2013.01); H03F 1/0288 (2013.01); H03F 3/19 (2013.01); H03F 3/195 (2013.01); H03F 3/211 (2013.01); H03F 3/245 (2013.01); H04B 1/04 (2013.01); H04B 1/0483 (2013.01); H03F 2200/213 (2013.01); H03F 2200/408 (2013.01); H03F 2200/451 (2013.01); H03F 2203/21106 (2013.01); H04B 2001/045 (2013.01); H04B 2001/0425 (2013.01); H04W 88/08 (2013.01)

(58) Field of Classification Search
CPC .......... H03F 1/565; H03F 3/20; H03F 3/195; H03F 3/211; H03F 3/602; H03F 2200/451; H03F 2200/543; H03F 2203/21142; H04B 1/04; H04B 1/0475; H04B 1/0483; H04B 1/40; G06G 7/10
USPC .................... 455/114.3, 127.1, 127.2, 127.3; 330/124 R, 129, 278, 284, 295; 375/296, 297
See application file for complete search history.

(56) References Cited

U.S. PATENT DOCUMENTS 5,568,087 A * 10/1996 Gatti .................... H03F 1/3252
330/149
5,752,170 A * 5/1998 Clifford ............... H03G 3/3042
455/127.2

(Continued)

FOREIGN PATENT DOCUMENTS

WO 2014108716 A1 7/2014

*Primary Examiner* — Quochien B Vuong

(57) ABSTRACT

An RF power amplifier circuit has an input terminal for receiving an input signal having an input power, and an output terminal for outputting an output signal. The RF power amplifier circuit comprises three amplifier stages and an input power splitter for providing respective power fraction signals to respective inputs of each amplifier stage. The input power splitter comprises a first input transmission line arranged between a first node and a second node, a second input transmission line arranged between a third node and a fourth node, and an electrical reactive element having a first terminal electrically connected to both the first and the second nodes, and a second terminal electrically coupled to a third one of the respective three inputs.

20 Claims, 8 Drawing Sheets

(56) References Cited

U.S. PATENT DOCUMENTS

| | | | |
|---|---|---|---|
| 6,060,951 | A | 5/2000 | Inoue |
| 6,085,074 | A * | 7/2000 | Cygan .................. H03F 1/0288 330/295 |
| 6,833,761 | B2 | 12/2004 | Staudinger et al. |
| 7,078,976 | B2 | 7/2006 | Blednov |
| 7,417,508 | B1 * | 8/2008 | Quaglietta ................ H03F 1/56 330/124 R |
| 8,736,347 | B2 * | 5/2014 | Ahmed .................... G06G 7/10 327/355 |
| 9,077,285 | B2 * | 7/2015 | Holmes ................ H03F 1/0288 |
| 2013/0265107 | A1 | 10/2013 | Holmes |

* cited by examiner

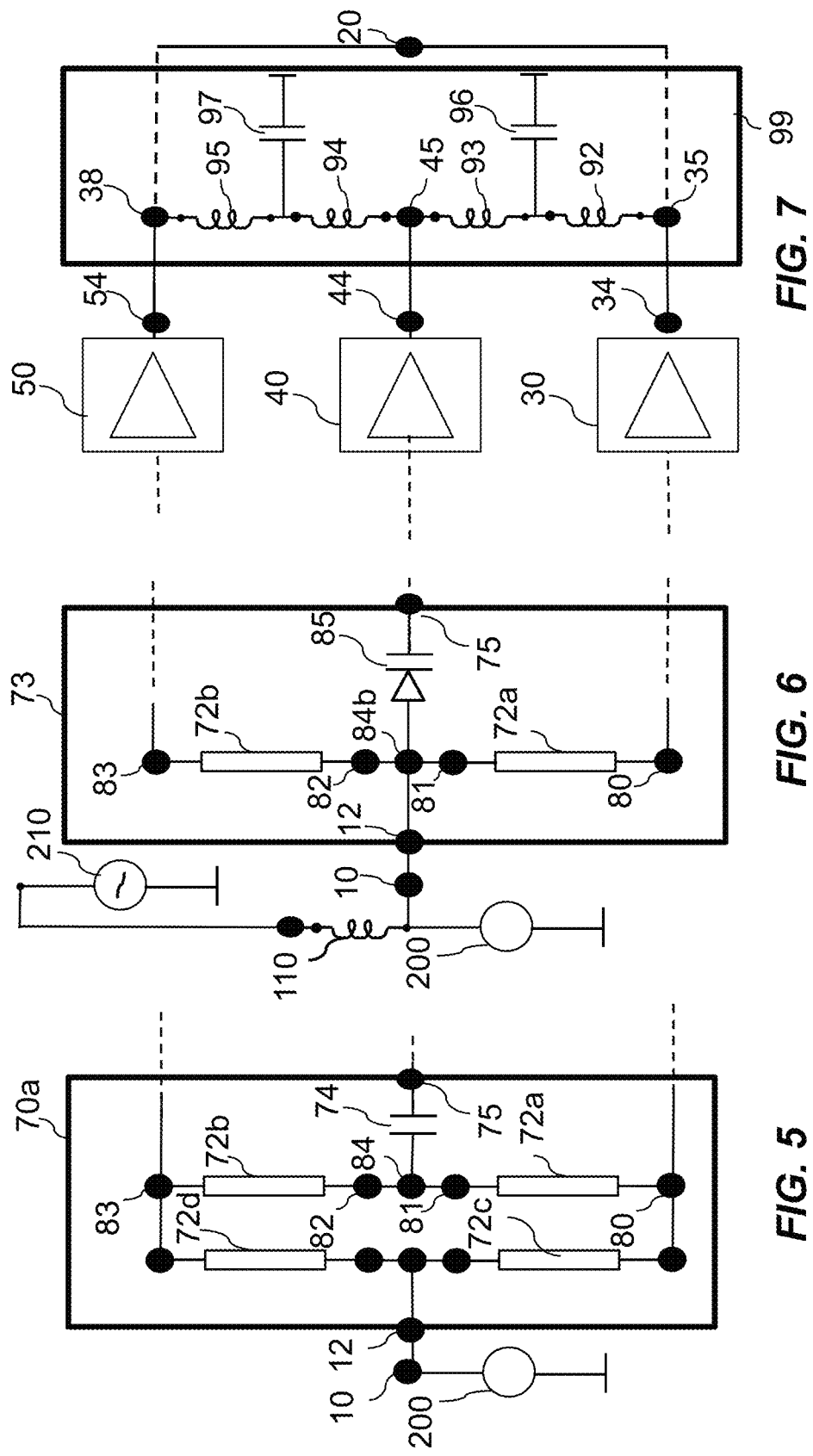

RADIO FREQUENCY POWER AMPLIFIER CIRCUIT

CROSS REFERENCE TO RELATED APPLICATION(S)

The present application claims priority to International Patent Application No. PCT/IB2014/000963, entitled "A RADIO FREQUENCY POWER AMPLIFIER CIRCUIT," filed on May 15, 2014, the entirety of which is herein incorporated by reference.

FIELD OF THE INVENTION

This invention relates to a radio frequency power amplifier circuit, a radio frequency base station and a communications system.

BACKGROUND OF THE INVENTION

A radio frequency (RF) power amplifier (PA) is a device for receiving an input RF signal having an input power and generating an output RF signal that has an output power which is larger than the input power. The input RF signal can be, e.g., an input current and/or an input voltage. The output RF signal can be, e.g., an output current and/or an output voltage. An RF PA may also be referred to simply as an amplifier. The power ratio of the output RF signal with respect to the input RF signal is commonly referred to as the power gain. An ideal amplifier has a power gain that is independent of the power of the input RF signal. In practice, however, an RF amplifier is not able to output an arbitrarily high power. The power gain of an amplifier therefore tends to become smaller with increasing input power. For example, the power gain may be limited by a maximal output current capability of the RF PA. The power domain of the input RF signal for which the power gain may be considered constant is known as the linear domain or linear regime. When the input power exceeds the linear domain, the amplifier is commonly said to be saturated or to work in the saturation regime.

Typically, RF PAs operational in the linear domain or linear regime, e.g., at low or intermediate input power levels, are less power efficient than RF PAs operational in the saturation regime, e.g., at high input power levels. A RF PA operational in the linear regime may have enhanced linearity but lower power efficiency than a PA operational in the saturation regime.

Techniques are described in literature to improve the power efficiency at low and intermediate input power levels while maintaining the power efficiency in the saturation regime. An example of such techniques is shown in U.S. Pat. No. 7,078,976 B2. U.S. Pat. No. 7,078,976 B2 describes an example of a Doherty amplifier circuit with a main amplifier stage and a peak amplifier stage both connected with an input power splitter at the input, and with an output power combiner at the output.

The input power splitter and the output power combiner are both integrated in one Doherty amplifier package. However, integration of the input power splitter and the output power combiner in the Doherty amplifier package may require that a large amount of layout space of the Doherty amplifier package is dedicated to the integration of the input power splitter and the output power combiner, thereby increasing the costs of the Doherty amplifier package. Further, integration of the input power splitter and the output power combiner in the Doherty amplifier package limits accessibility to the input power splitter and output power combiner from the outside, thereby limiting external control of the performance of the Doherty amplifier circuit.

SUMMARY OF THE INVENTION

The present invention provides a radio frequency power amplifier circuit, a radio frequency base station and a communications system as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. In the Figures, elements which correspond to elements already described may have the same reference numerals.

DETAILED DESCRIPTION OF THE PREFERRED EMBODIMENTS

Hereinafter in describing the Figures, if not otherwise stated, the following conventions are used: black dots indicate electrical nodes or electrical terminals, continuous lines connecting two points in a circuit or layout indicate a direct electrical connection, dashed lines connecting two points in a circuit or layout indicate an electrical coupling between the two nodes or, e.g. one or more components may be used between the two points to electrically connect the two points.

Figure 1:
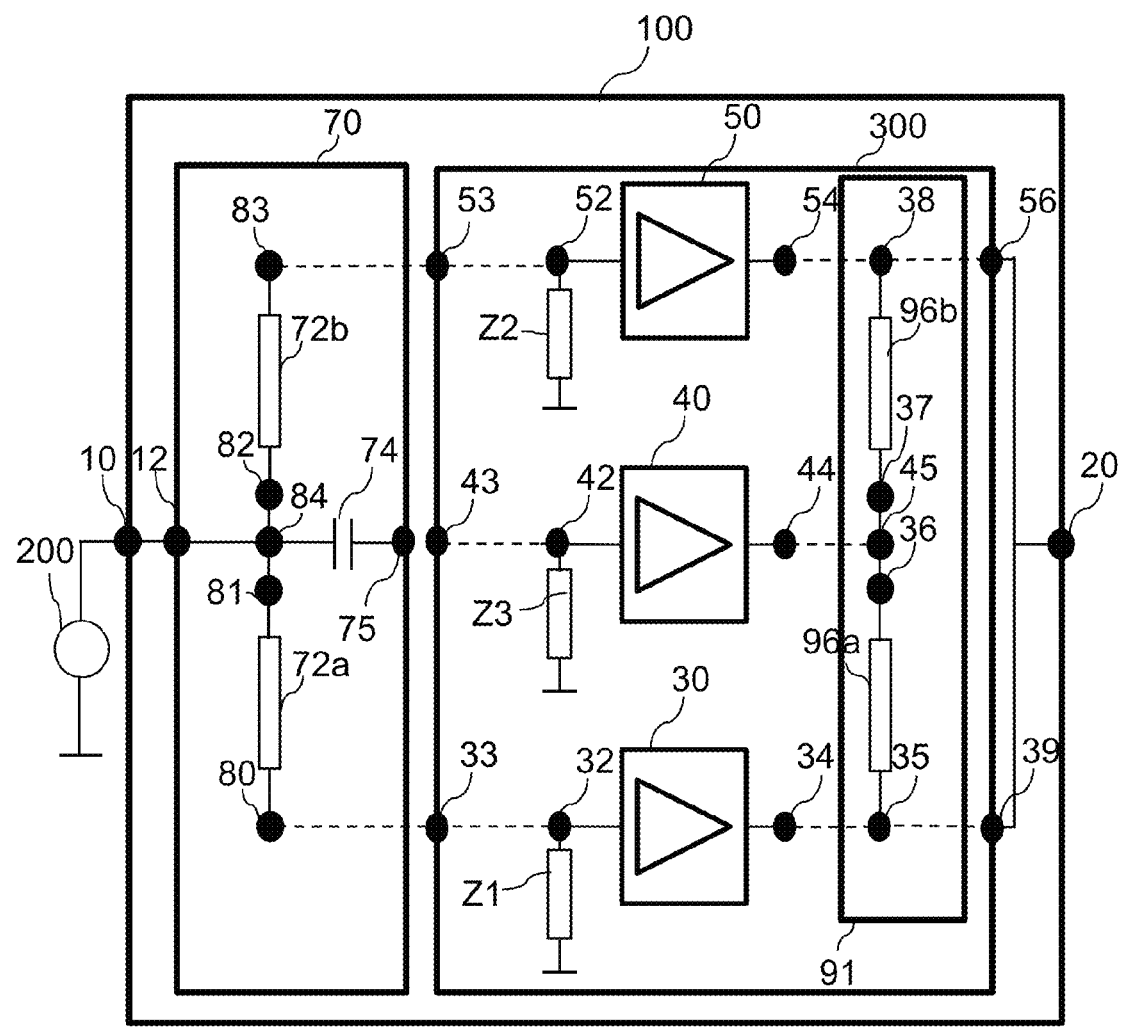
FIG. 1 schematically shows an equivalent circuit diagram of a radio frequency power amplifier circuit.

FIG. 1 shows a radio frequency (RF) power amplifier circuit 100. The RF power amplifier circuit 100 has an input terminal 10 for receiving an input RF signal and an output terminal 20 for outputting an output RF signal. The input RF signal may be generated by a power source 200. The input RF signal has an input power level which is amplified by the RF power amplifier circuit 100 to a higher output power level of the output RF signal.

The power source 200 may be for example a suitable signal generator or a previous amplifying stage suitable for the specific implementation.

The RF power amplifier circuit 100 further comprises three amplifier stages: a first amplifier stage 30, a second amplifier stage 50 and a third amplifier stage 40. The first amplifier stage 30 has a first input 32 and a first output 34, the second amplifier stage 50 has a second input 52 and a second output 54, and the third amplifier stage 40 has a third input 42 and a third output 44.

The first amplifier stage 30 may have a first internal input impedance Z1, the second amplifier stage 50 may have a second internal input impedance Z2 and the third amplifier stage 40 may have a third internal input impedance Z3.

The respective inputs 32, 52 and 42 of the three amplifier stages 30, 50 and 40 are electrically coupled to the input terminal 10 via an input power splitter 70. The first input 32, the second input 52 and the third input 42 are arranged to receive a respective power fraction signal having a respective power fraction of the input power. The input power splitter 70 provides to the respective inputs 32, 52 and 42 the respective power fraction signals having the respective power fractions of the input power.

The respective outputs 34, 54 and 44 output respective output RF signals, e.g. a first output RF signal, a second output RF signal and a third output RF signal, of the three amplifier stages 30, 50 and 40. The respective outputs 34, 54 and 44 are electrically coupled to the output terminal 20.

For example, the first output 34, the second output 54 and the third output 44 may be electrically coupled to the output terminal 20 via an output power combiner 91 combining said first output RF signal, second output RF signal and third output RF signal, into the output RF signal at the output terminal 20. The output power combiner 91 may for example have, as shown in FIG. 1, the first output 34, the second output 54 and the third output 44 as inputs of the output power combiner 91.

The output power combiner 91 may comprise a first output transmission line 96a arranged between a first output node 35 and a second output node 36, and a second output transmission line 96b arranged between a third output node 37 and a fourth output node 38. The first output node 35 may be electrically coupled to the respective first output 34, the fourth output node 38 may be electrically coupled to the respective second output 54, and both the second output node 36 and the third output node 37 may be electrically coupled to the third output 44.

Figure 3:
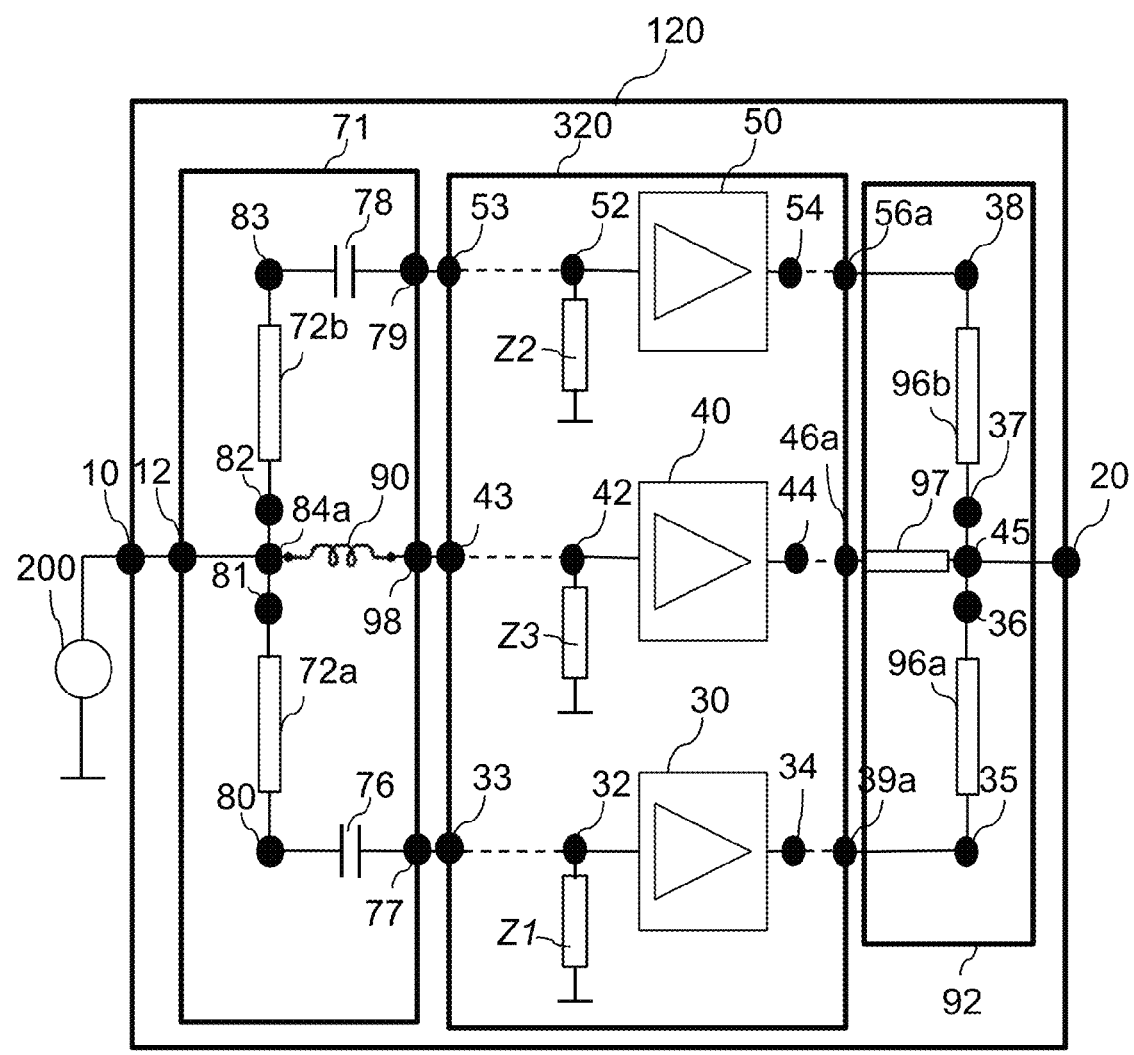

The input power splitter 70 comprises a splitter input terminal 12, a first input transmission line 72a arranged between a first node 80 and a second node 81, a second input transmission line 72b arranged between a third node 82 and a fourth node 83, and an electrical reactive element. The splitter input terminal 12 is electrically connected to the input terminal 10 for receiving the input RF signal from the input terminal 10. The second node 81 and the third node 82 may be directly electrically connected to the input terminal 10 as shown in FIG. 1. In the example of FIG. 1, the first node 80 is electrically coupled to the first input 32 and the fourth node 83 is electrically coupled to the second input 52. The electrical reactive element has a first terminal 84 and a second terminal 75. The electrical reactive element shown in FIG. 1 is a capacitive element 74. The electrical reactive element may be an inductive element 90 as shown in FIG. 3 or a variable reactance diode 85 as shown in FIG. 6. The first terminal 84 is electrically connected to both the second node 81 and the third node 82. The splitter input terminal 12 is electrically coupled to the first terminal 84. The splitter input terminal 12, as shown in FIG. 1, may be directly electrically connected to the first terminal 84. The second terminal 75 is electrically coupled to the third input 42. In this example, the second node 81 and the third node 82 may be capacitively coupled to the third input 42 via the capacitive element 74 while the first node 80 and the fourth node 83 may be inductively connected to the first input 32 and to the second input 52, respectively.

The RF power amplifier circuit 100 may comprise an RF power amplifier package 300.

The first amplifier stage 30, the second amplifier stage 50 and the third amplifier stage 40 together with the output power combiner 91 may be integrated in the RF power amplifier package 300. The RF power amplifier package 300 shown in FIG. 1 has a first input lead 33, a second input lead 53, a third input lead 43, and a first output lead 39 and a second output lead 56 to electrically connect the RF power amplifier circuit 100 to an external circuit. The external circuit may for example be implemented on an external printed circuit board (PCB) in order bring into operation the RF power amplifier circuit 100, thus connecting it to, e.g., the power source 200 and/or to a bias circuitry for biasing the three amplifier stages 30, 50 or 40, etc. The first input 32 of the first amplifier stage 30 may be electrically coupled to the first input lead 33, the second input 52 may be electrically coupled to the second input lead 53 and the third input 42 may be electrically coupled to the third input lead 43, respectively. Similarly the first output 34 may be electrically coupled to the first output lead 39, the second output 54 may be electrically coupled to the second output lead 56. The third output 44 may be electrically coupled to both the second output node 36 and the third output node 37. Both the first output lead 39 and the second output lead 56 may be electrically connected to the output terminal 20 of the RF power amplifier circuit 100.

The input power splitter 70 is arranged outside the RF power amplifier package 300. The input power splitter 70 may for example be arranged in the PCB external to the RF power amplifier package 300. The capacitive element 74, the first input transmission line 72a and the second input transmission line 72b are implemented outside the RF power amplifier package 300 so that they can be more easily accessed and changed. The capacitive element 74 may be, as shown later in FIG. 2b, a discrete surface mounting device (SMD) component solderable on the PCB. The discrete SMD component may be replaced during a tuning phase of the input power splitter 70 and its value changed.

Depending on the value of said capacitive element 74, the RF power amplifier circuit 100 may be arranged to operate e.g. as a Doherty amplifier or as, for example, a class AB amplifier.

A Doherty amplifier is an amplifier that comprises a main amplifier and a peak amplifier, which are combined at an input and at an output by a respective input power splitter and a respective output power combiner. The peak amplifier as well as the main amplifier may include one or more amplifier stages connected in parallel. The input power splitter provides a first power fraction signal having a first predetermined power fraction of the input power to the main amplifier and a second power fraction signal having a second predetermined power fraction of the input power to the peak amplifier, respectively. The first predetermined power fraction of the input power has typically a different magnitude than the second predetermined power fraction.

Input power fraction signals of the main and peak amplifiers may typically have a relative phase shift of 90 degrees.

The output power combiner typically allows to control a load of the main amplifier by using the second predetermined power fraction. When the input power is in a linear domain of the main amplifier, the peak amplifier may be switched off (e.g. a bias current or voltage of the peak amplifier may be reduced) to save energy and improve efficiency. The linear domain may be below an average power level of the Doherty amplifier input RF signal. The input RF signal may be modulated e.g. in frequency, amplitude or phase domain. When the input power exceeds the linear domain of the main amplifier, however, the peak amplifier may be switched on to assist the main amplifier in generating the output RF signal. The Doherty amplifier therefore may have a linear domain that is larger than both a linear domain of the main amplifier and a linear domain of the peak amplifier. The output of the main amplifier and the output of the peak amplifier may be combined in a combining node to generate the output RF signal of the Doherty amplifier.

A class AB amplifier has linearity characteristics similar to a class A amplifier at relatively low input power levels. Biasing of a class AB amplifier is set such that an output current flowing in an output stage of the class AB amplifier, flows for more than half a signal cycle but less than a complete signal cycle, thus improving the power efficiency of the class AB amplifier compared to, for example, the power efficiency of a class A amplifier.

In FIG. 1, when the value of the capacitive element 74, or the respective electrical reactive element 90 or 85 shown in FIGS. 3 and 6, is tuned in a manner that the first power fraction and the second power fraction are higher than the third power fraction, the third amplifier stage 40 is said to operate in back-off with respect to the first amplifier stage 30 and the second amplifier stage 50. In this case the radio frequency amplifier circuit 100 may be capable to be operated as a Doherty amplifier and both the first amplifier stage 30 and the second amplifier stage 50 may be together the peak amplifier stage, and the third amplifier stage 40 may be the main amplifier stage of the Doherty amplifier.

Alternatively, when the value of the first capacitive element 74 or the respective electrical reactive element 90 or 85 shown in FIGS. 3 and 6, is tuned for example in a manner that the first power fraction, the second power fraction and the third power fraction are substantially equal, the first amplifier stage 30, the second amplifier stage 50 and the third amplifier stage 40 are operating with the same input power level, received at the first input 32, at the second input 52 and at the third input 42, respectively. In this case, the RF amplifier circuit 100 is capable to be operated as a class AB amplifier.

It should be noted that the class of operation may depend on bias conditions as well, e.g. on current or voltage bias conditions. Thus, for example, for a class AB amplifier a biasing of three amplifier stage 30, 50 and 40 may have substantially the same level.

Figure 2A:
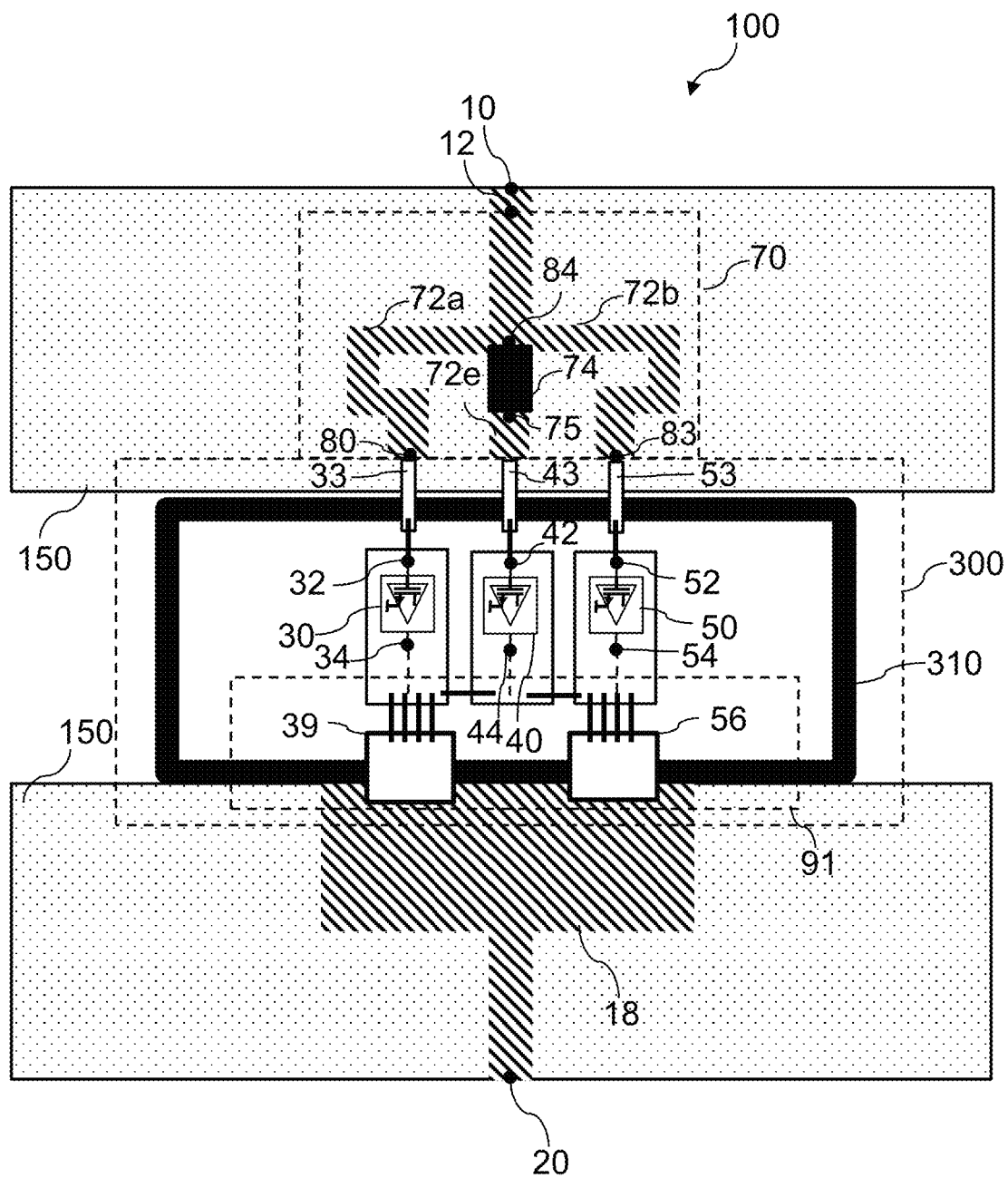
FIG. 2a shows a top view of a radio frequency power amplifier circuit, performing according to the equivalent circuit diagram of FIG. 1.

FIG. 2a shows a top view of a RF power amplifier circuit 100, performing according to the equivalent circuit diagram shown in FIG. 1. In FIG. 2a elements having the same reference numbers of FIG. 1 have the same function and will be hereafter not described in further details. The RF power amplifier circuit 100 may comprise the RF amplifier package 300 mounted or bolted down on a printed circuit board (PCB) 150. The RF power amplifier package 300 may comprise a supporting means 310 on which the first amplifier stage 30, the second amplifier stage 50 and the third amplifier stage 40 may be mounted. The RF power amplifier package 300 is described in detail with reference to FIG. 2b further below.

Referring to FIG. 2a, the input power splitter 70 is arranged in the PCB 150 external to the RF power amplifier package 300. More specifically, the first transmission line 72a, the second transmission line 72b and the first capacitive element 74, are entirely implemented on the PCB 150. The first input lead 33, the second input lead 53 and the third input lead 43 are in electrical contact with the first transmission line 72a, the second transmission line 72b and a third metal line 72e connected to the second terminal 75 of the first capacitive element 74.

As shown in FIG. 2a the output power combiner 91 may comprise bondwires connecting the outputs 34, 44 and 54 to the first output lead 39 and the second output lead 56.

In FIG. 2a it is further shown that the third output 44 is electrically coupled to the output terminal 20 via the first output lead 39 and the second output lead 56. However, a third output lead may be present (not shown in FIG. 2a) which may electrically connect the third amplifier stage 40 at its output to the output terminal 20. The first output lead 39 and the second output lead 56 are in electrical contact with metal 18 on the PCB 150. The metal 18 is electrically connected to the output terminal 20 of the RF power amplifier circuit 100.

The first input transmission line 72a and the second transmission line 72b may be formed or implemented in any manner suitable for the specific implementation.

For example, the first input transmission line 72a and the second input transmission line 72b may be implemented, as shown in FIG. 2a, as metal lines or microstrip lines on the PCB 150. For example, the PCB 150 may be a multi-layered PCB 150 with multiple metal layers separated by dielectric layers (e.g. FR4, LTCC or type of suitable material). The first input transmission line 72a and the second input transmission line 72b may be implemented on a metal layer at a surface of the PCB 150 at a certain distance from a ground metal plane located for example at another opposite surface of the PCB 150.

For example, the first input transmission line 72a and the second input transmission line 72b may be metal strip lines of suitable desired electrical length. The first input transmission line 72a and the second input transmission line 72b may alternatively be implemented partially or completely with a series of lumped or distributed series inductors and shunt capacitors in order to obtain the desired electrical length. The lumped series inductors and shunt capacitors forming the first input transmission line 72a and/or the second input transmission line 72b may be for example discrete components, such as surface mounting devices (SMDs), soldered on the PCB 150, or integrated components on a separate semiconductor die attached to the PCB 150.

The first input transmission line 72a has a first input physical length and a first input electrical length. The second input transmission line 72b has a second input physical length and a second input electrical length. The first input physical length and the first input electrical length, as well as the second input physical length and the second input electrical length depend on a material through which the electromagnetic waves propagate. For example, in case the first input transmission line 72a and the second input transmission line 72b are microstrip lines on top of a PCB dielectric substrate, the respective first and second input electrical and physical lengths depend on the characteristics of the dielectric substrate, e.g. a dielectric constant, a dielectric thickness, etc. of the dielectric substrate, through which the electromagnetic waves propagate. Since electromagnetic waves propagate in the material, e.g. the dielectric substrate of the PCB 150, to a much lower speed than in the free space, the first input electrical length and second input electrical length are always longer than their respective first input physical length and second input physical length. As shown in FIG. 2a the first input physical length may be substantially equal to the second input physical length. When both the first input transmission line 72a and the second input transmission line 72b are integrated in the same PCB 150 having the same dielectric substrate, and both have an equal physical length, they both have also an equal electrical length.

It should be noted that the first input electrical length and the second input electrical length of the first input transmission line 72a and second input transmission line 72b, respectively, may allow identical signal propagation time. Their respective characteristic impedances depend on the input impedances Z1, Z2 and Z3, of the first amplifier stage 30, second amplifier stage 50 and third amplifier stage 40 and as well as on parasitic components present in the RF power amplifier package 300 or power amplifier stages 30, 50 and 40.

For example, the electrical length between the first input 32 and the second input 52 may be 180 degrees or half of a wavelength of the propagating signal. The first terminal 84 of the first capacitive element 74 may tap both the first input transmission line 72a and the second input transmission line 72b at an electrical distance of 90 degree from the first input 32 and the second input 52, respectively. In other words, the first input transmission line 72a and the second input transmission line 72b may be combined in a single transmission line with the first node 80 closely adjacent to the first input 32 and the fourth node closely adjacent to the second input 52. The single transmission line may have a total electrical length of 180 degrees and may be tapped at a middle point by the capacitive element 74. The capacitive element 74 may be connected with the first terminal 84 at the middle point of the single transmission line. A first electrical length between the first input 32 and the middle point, e.g. the first terminal 84 of the capacitive element 74 in the example shown in FIG. 2a, may be 90 degrees. A second electrical length between the second input 52 and the middle point, e.g. the first terminal 84 in the example shown in FIG. 2a, may be identical to the first electrical length.

The capacitive element 74 may be a discrete capacitor soldered on the PCB 150, e.g. an SMD, a discrete capacitor integrated in the PCB or in a separate die. The capacitive element 74, may be tunable such that its capacitor value can be set to obtain a first power fraction signal having a first power fraction of the input power received at the respective first input 32, a second power fraction signal having a second power fraction of the input power received at the respective second input 52 and a third power fraction signal having a third power fraction of the input power received at the respective third input 42.

The third amplifier stage 40 may be located between the first amplifier stage 30 and the second amplifier stage 50. With this arrangement high symmetry may be achieved with reference to the third amplifier stage 40. Components and sizes of the first and second amplifier stages 30 and 50 (e.g. the peak amplifier stage in the Doherty amplifier operation) may be equal, facilitating the design and manufacturing of the RF power amplifier circuit 100.

Figure 2B:
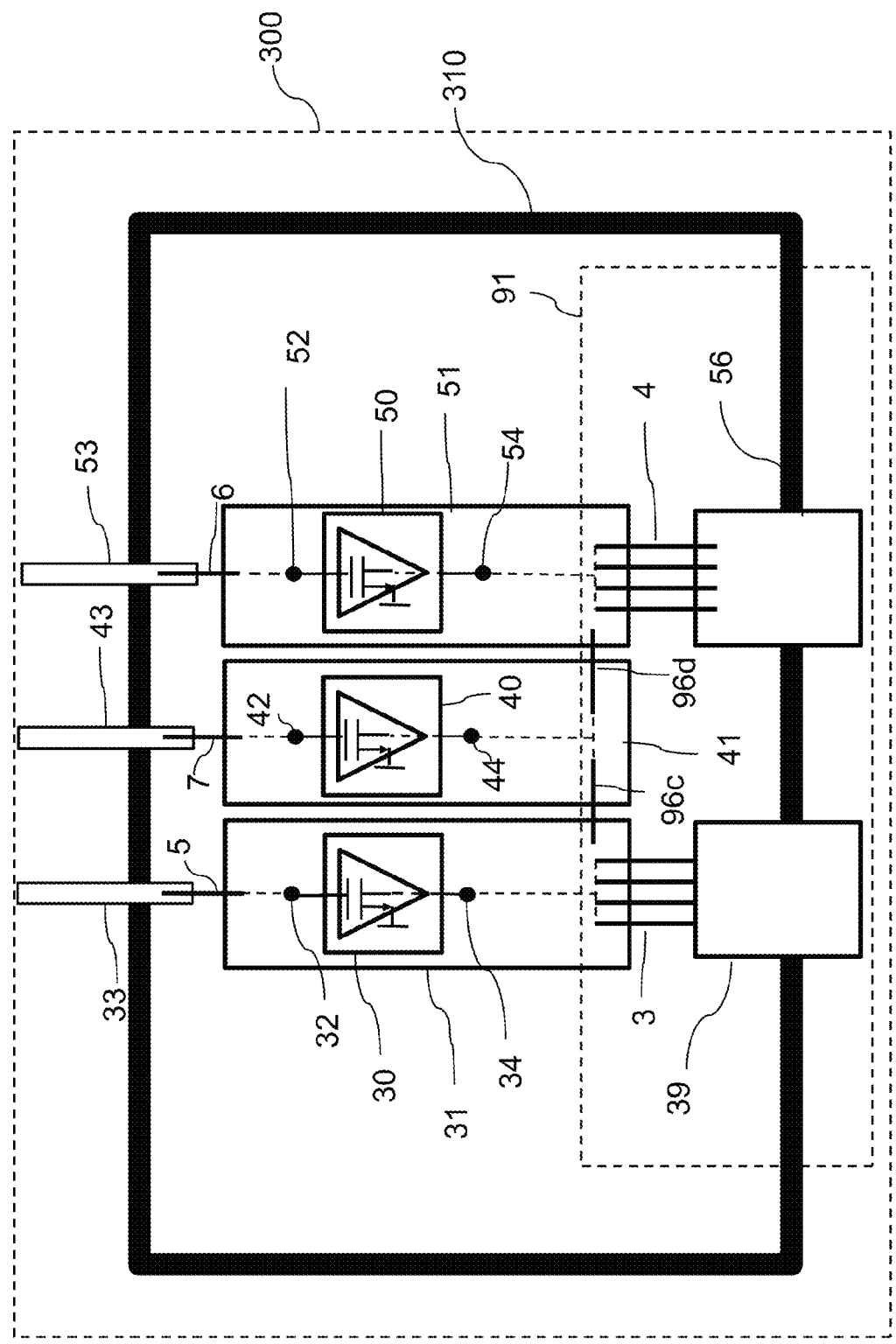
FIG. 2b shows a top view of a radio frequency power amplifier package, suitable for the example of FIG. 2a, FIG. 3 schematically shows an equivalent circuit diagram of a radio frequency power amplifier circuit.

FIG. 2b shows in detail the RF power amplifier package 300 shown in FIG. 2a.

The RF power amplifier package 300 comprises the first, second and third input leads 33, 53 and 43 and the first and second output leads 39 and 56 as described with reference to the equivalent circuit of FIG. 1.

The first input lead 33, the second input lead 53 and the third input lead 43 are electrically connected to the first input 32, second input 52 and third input 42 through a first bondwire 5, a second bondwire 6 and a third bondwire 7, respectively. The first output lead 39 is electrically connected to the first output 34 via bondwires 3 and the second output lead 56 is electrically connected to the second output 54 via bondwires 4. In this example bondwires 3, 4, 5, 6 and 7 are used as electrical conductive connections between the inputs 32, 52 and 42 and the respective input leads 33, 53 and 43, and between the outputs 34, 54 and the respective first output lead 39 and the second output lead 56. However, other types of electrical conductive connections may be used, e.g. metal lines, conductive lines pressed or soldered to the respective leads.

The output power combiner 91 shown in FIG. 2b is integrated in the RF power amplifier package 300. The first output transmission line 96a and the second output transmission line 96b shown in the equivalent circuit of FIG. 1 may be implemented with a first output bondwire 96c and a second output bondwire 96d, respectively.

The first amplifier stage 30, the second amplifier stage 50 and the third amplifier stage 40 may be on separate semiconductor dies, e.g. integrated in a first semiconductor active die 31, a second semiconductor active die 51 and a third semiconductor active die 41, respectively. The third semiconductor active die 41 may be physically located between the first semiconductor active die 31 and the second semiconductor active die 51.

Alternatively the first amplifier stage 30, the second amplifier stage 50 and the third amplifier stage 40 may be integrated in a single die. In the single die the third amplifier stage 40 may be physically located between the first amplifier stage 30 and the second amplifier stage 50.

The first amplifier stage 30 may comprise a first power transistor (schematically drawn in FIG. 2b with the symbol of a MOSFET) having a first area. The second amplifier stage 50 may comprise a second power transistor having a second area and the third amplifier stage 40 may comprise a third power transistor having a third area. The first area may be substantially equal to the second area. The first area and the second area may be substantially equal to the third area. The first semiconductor active die 31 may be substantially equal in size to the second semiconductor active die 51 and substantially equal in size to the third semiconductor active die 41.

In Doherty operation, a sum of the first area with the second area gives a total area of the peak amplifier whereas the third area gives an area of the main amplifier. For so-called asymmetrical Doherty amplifiers, the area of the main amplifier is different from the total area of the peak amplifier. For example, the area of the main amplifier may be half the size of the total area of the peak amplifier.

Asymmetrical Doherty amplifiers can work with enhanced efficiency at a given back-off level from the maximum power level compared to symmetrical Doherty amplifiers, e.g. wherein the peak amplifier and the main amplifier have the same areas.

The arrangements shown in FIGS. 2a and 2b show three identical semiconductor active dies 31, 51 and 41 integrating three identical power transistors thus providing a total peak amplifier area to main amplifier area ratio of two to one. In another example the first area of the first power transistor may be two times larger than the third area of the third power transistor and the second area of the second power transistor may be equal to the first area. In the latter example a total peak amplifier area to main amplifier area ratio of four to one may be obtained, thus enhancing the power efficiency for larger back-off levels. However any other total peak amplifier area and any other main amplifier area can be implemented to obtain ratios suitable for the specific implementation.

The first power transistor, the second power transistor and the third power transistor may have respective control terminals, output terminals and reference terminals electrically coupled to respective input leads 33, 53, and 43, output leads 39 and 56 and one or more reference leads (not shown in FIG. 2*a*) of the radio frequency power amplifier package 300. The one or more reference leads can be one or more metal plates of the RF power amplifier package 300 electrically connected to the semiconductor active dies 31, 51 and 41 via for example bondwires. Alternatively the one or more reference leads may coincide or be in electrical contact with the supporting means 310 which may be electrically conductive and electrically connected to bottom sides of the semiconductor active dies 31, 51 and 41. The bottom sides of the semiconductor active dies 31, 51 and 41 may be electrically connected to a ground plane of the PCB 150.

The first power amplifier stage 30, the second power amplifier stage 50 and the third power amplifier stage 40 may comprises several power transistor stages connected for example in series or in parallel or in any manner suitable for the specific implementation.

The arrangement shown in FIG. 2*a* and FIG. 2*b* allows to design asymmetrical Doherty amplifiers in a symmetrical physical arrangement. The symmetrical physical arrangement facilitates the design phase and may provide the manufacturer of the radio frequency power amplifier circuit 100 or 120 with a more modular design approach in which the semiconductor active dies 31, 51 and 41 are identical and produced during the same manufacturing process. The radio frequency power amplifier package 300 can be assembled with said substantially identical semiconductor active dies 31, 51 and 41 and used in combination with the input power splitter 70 integrated in the external PCB 150.

Although the arrangement shown in FIG. 2*a* and FIG. 2*b* may allow to design asymmetrical Doherty amplifiers, the same physical arrangement may be used to realize also a symmetrical Doherty amplifier operation by for example switching off one of the peak amplifier stages 30 or 50. For example, a biasing circuitry of the peak amplifier stage 30 or 50 may be disabled or a bias voltage or current in the respective peak power amplifier stage 30 or 50 reduced at times when the asymmetrical Doherty amplifier is used as a symmetrical Doherty amplifier and one of the amplifier stages 30 or 50 may be switched off. Alternatively, in the symmetrical Doherty amplifier, the amplifier stage 30 or 50 may be electrically disconnected from the RF power amplifier package 300.

The RF power amplifier package 300 may be used for applications or types of amplifiers by only modifying the input power splitter 70, by for example changing the electrical length of the first input transmission line 72*a* or the second input transmission line 72*b* or the value of the capacitor 74. The different type of amplifiers may for example be: asymmetrical Doherty amplifiers, symmetrical Doherty amplifiers or any other Doherty amplifiers suitable for the specific implementation or class AB power amplifiers.

By integrating the input power splitter 70 in the PCB 150, the realization of the RF power amplifier circuit 100 according to design specifications can be achieved with less effort in shorter times. The PCB 150 is typically manufactured with a process which is faster, simpler and cheaper than a process with which the semiconductor active dies 31, 51 and 41 are manufactured.

The symmetrical arrangement further reduces the impact of process variations. For example, relative changes of the electrical lengths of the first input transmission line 72*a* and of the second input transmission line 72*b* with respect to variations of electrical parameters in the manufacturing of the PCB 150 such as variations in a thickness of a dielectric layer, variations in a dielectric constant of the dielectric layer, tolerances in a metal thickness etc., are reduced. A symmetrical arrangement helps also to alleviate the effects of variations of the length, height and diameters of the bondwires or of other electrical characteristics of any other type of electrical conductive connections used to connect the package input or output leads 33, 53 and 43 or 39 and 56 to the respective inputs 32, 52 and 42 or 34, 54 and 44.

The RF power amplifier circuit 120 may use any input power splitter and any output power combiner suitable for the specific implementation.

Referring to the example of FIG. 3, the input power splitter 71 differs from the input power splitter 70 of FIG. 1 and FIG. 2*a* in that the second input node 81 and the third input node 82 may be inductively coupled, and not capacitively coupled, to the third input 42. For example, the input power splitter 71 comprises the first input transmission line 72*a* and the second input transmission line 72*b* as described for the RF power amplifier circuit 100 of FIG. 1, and additionally a second capacitive element 76, and a third capacitive element 78. A third terminal of the second capacitive element 76 is electrically connected to the first node 80 and a fourth terminal 77 of the second capacitive element 76 is electrically coupled to the first input 32. A fifth terminal of the third capacitive element 78 is electrically connected to the fourth node 83 and a sixth terminal 79 of the third capacitive element 78 is electrically coupled to the second input 52. The second node 81 and the third node 82 are electrically coupled to the third input 42. In the example of FIG. 3 the second node 81 and the third node 82 are electrically coupled to the third input 42 via an inductive element 90 having a first inductor terminal 84*a* and a second inductor terminal 98. The first inductor terminal 84*a* is electrically connected to both the second node 81 and the third node 82 which are both electrically connected to the splitter input terminal 12 and to the input terminal 10. The second inductor terminal 98 is electrically coupled to the third input 42 of the third amplifier stage 40. In this example, impedances seen at the first input lead 33, the second input lead 43 and the third input lead 53 towards the respective first amplifier stage 30, second amplifier stage 50 and third amplifier stage 40 may be inductive. For example the first input impedance Z1 in series with the series electrical conductive connection between the first input 32 and the first input lead 33 may be inductive. The second input impedance Z2 in series with a second series electrical conductive connection between the second input 52 and the second input lead 53 may be inductive. Similarly the third input impedance Z3 in series with a third series electrical conductive connection between the third input 42 and the third input lead 43 may be inductive. Other parasitic impedances (not shown in the Figures) such as for example shunt parasitic capacitors of the input leads 33, 53 and 43 may be taken into account when calculating impedances seen at the first input lead 33, the second input lead 43 and the third input lead 53 towards the respective first amplifier stage 30, second amplifier stage 50 and third amplifier stage 40.

The first inductive element 90 may be implemented in any manner suitable for the specific implementation.

The inductive element 90 may for example be a discrete inductor, e.g. an SMD component soldered on a PCB, or a discrete inductor integrated in a PCB or in a semiconductor die of a suitable semiconductor technology. Alternatively, the inductive element may be implemented as an inductive transmission line integrated on the PCB or integrated in the semiconductor die of the suitable semiconductor technology. The inductive transmission line may be implemented with lumped capacitors and inductors component in a low pass or high pass configuration. The inductive transmission line may have an electrical length of 180 degrees.

The inductive element 90, similarly to the capacitive element 74 shown in FIGS. 1 and 2a, may be tunable such that its inductor value can be set to obtain a first power fraction signal at the respective first input 32, a second power fraction signal at the respective second input 52 and a third power fraction signal at the respective third input 42. The first power fraction signal has a first power fraction of the input power, the second power fraction signal has a second power fraction of the input power, and the third power fraction signal has a third power fraction of the input power. The inductive element 90 may be tuned to regulate the first and second power fractions relative to the third power fraction, thereby setting the RF power amplifier circuit 120 into a suitable class of operation.

In the input power splitter 71, the second capacitive element 76 and the third capacitive element 78 may be used for additional power split control or as matching components or/and as DC blocking components. The second capacitive element 76 and the third capacitive element 78 may be discrete capacitors or be implemented in any other manner specific for the specific implementation.

Figure 4A:
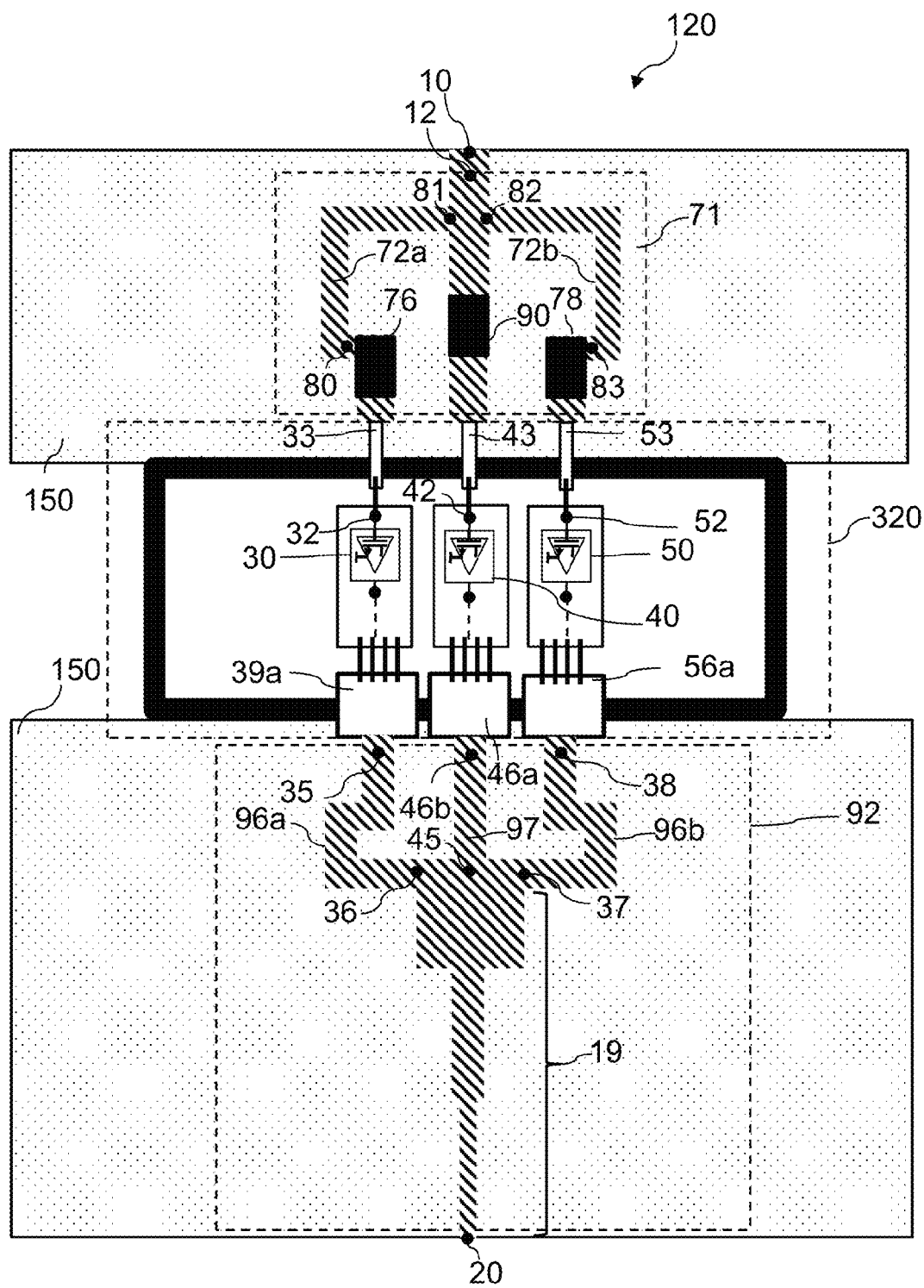
FIG. 4a shows a top view of a radio frequency power amplifier circuit, performing according to the equivalent circuit diagram of FIG. 3.

In the example of FIG. 3, the output power combiner 92 is situated outside the RF power amplifier package 320 as shown in FIG. 4a and explained below. The output power combiner 92 may be integrated in a PCB. However, the output power combiner 92 may be integrated in the RF power amplifier package 320 similarly to the example shown through the FIGS. 1-2b. The first amplifier stage 30, the second amplifier stage 50 and the third amplifier stage 40 are integrated in the RF power amplifier package 320.

The output power combiner 92 comprises a first transmission line 96a arranged between a first output node 35 and a second output node 36, and a second output transmission line 96b arranged between a third output node 37 and a fourth output node 38. The first output node 35 is electrically coupled to the first output 34, and the fourth output node 38 is electrically coupled to the second output 54. The second output node 36 and the third output node 37 are further electrically coupled to the third output 44 via a third output transmission line 97. The third output transmission line 97 is arranged between the output 44 and a fifth output node 45. The fifth output node 45 is electrically connected to both the second output node 36 and the third output node 37. The fifth output node 45 is directly electrically connected to the output terminal 20 of the RF power amplifier circuit 120.

The RF power amplifier package 320 of FIG. 3 comprises a third output lead 46a which is electrically connected to the third output 44 and in that the output power combiner 92 is implemented externally to the RF power amplifier package 320.

The RF power amplifier package 320 has three output leads: a first output lead 39a, a second output lead 56a and a third output lead 46a. The first output lead 39a is electrically coupled to the first output 34, e.g. via bondwires, and to the first output node 35. The second output lead 56a is electrically coupled to the second output 54, e.g. via bondwires, and to the fourth node 38. The third output lead 46a is electrically coupled to the third output 44, e.g. via bondwires, and directly connected to the third output transmission line 97. The RF power amplifier package 320 has further three input leads, a first input lead 33, a second input lead 53 and a third input lead 43, as shown for the RF power amplifier package 300 shown through FIGS. 1 and 2a.

Electrical lengths of input and output transmission lines 72a, 72b and 96a, 96b of the respective input power splitter 71 and output power combiner 92 of the example of FIG. 3 may differ from the electrical lengths of the input and output transmission lines of the respective input power splitter 70 and output power combiner 91 in the example of FIG. 1. For example, the first input transmission line 72a, together with any components arranged between the first input node 80 and the first input 32 of the input power splitter 71, may have a first electrical length of 90 degrees. The second input transmission line 72b of the input power splitter 71, with any corresponding components arranged between the fourth node 83 and the second output 52, may have a second electrical length equivalent to the first electrical length. The inductive element 90, together with any components arranged between the terminal 98 and the third input 42, may provide a phase shift of 180 degrees.

Similarly, the first output transmission line 96a of the output power combiner 92 in conjunction with an electrical conductive connection between the first output 34 and the first output node 35 may have a first output electrical length of 180 degrees. The second output transmission line 96b of the output power combiner 92 in conjunction with an electrical conductive connection between the second output 54 and the fourth output node 38 may have a second output electrical length equivalent to the first electrical length.

FIG. 4a shows an example of an arrangement of a RF power amplifier circuit 120 behaving like the equivalent circuit of FIG. 3. Elements of the FIG. 4a having the same reference numbers of FIG. 3 will be not here described in further details. As shown, the RF PA circuit 120 comprises a package 320 mounted on a printed circuit board 150.

The RF power amplifier circuit 120 comprises an input power splitter 71 and an output power combiner 92 which are both external to the RF power amplifier package 320. The first amplifier stage 30, the second amplifier stage 50 and the third amplifier stage 40 are mounted inside the RF power amplifier package 320. By implementing the input power splitter 71 and the output power combiner 92 externally to the RF power amplifier package 320, both the input power splitter 71 and the output power combiner 92 can be tuned, e.g. by adjusting the value of the first inductive element 90, to obtain for example either a Doherty amplifier or a class AB power amplifier. The second capacitive element 76 may have the same value of the third capacitive element 78 and their same value further tuned for example for a more precise power splitting ratio. The input power splitter 71 comprises a first input transmission line 72a, a second input transmission line 72b, a second capacitive element 76, a third capacitive element 78, and the first inductive element 90. A first terminal of the second capacitive element 76 is electrically connected to the first input lead 33 and via the first input lead 33 to the first input 32. A second terminal of the second capacitive element 76 is connected to a first input node 80 at one end of a first input transmission line 72a. A second input node 81 at another end of the first input transmission line 72a is electrically connected to the splitter input terminal 12. The splitter input terminal 12 is electrically connected to the input terminal 10. A first terminal of the third capacitive element 78 is electrically connected to the second input lead 53 and via the second input lead 53 to the second input 52. A second terminal of the third capacitive element 78 is electrically connected to a fourth input node 83 at one end of a second input transmission line 72b. A third input node 82 at another end of the second input transmission line 72b is electrically connected to the splitter input terminal 12. A first terminal of the first inductive element 90 is electrically connected to the third input lead 43 and via the third input lead 43 to the third input 42. A second terminal of the first inductive element 90 is electrically connected to the splitter input terminal 10 through, in this example, a further line of suitable electrical length. The output power combiner 92 comprises a first output transmission line 96a, a second transmission line 96b and a third transmission line 97. The output power combiner 92 may comprise an additional output transmission line 19.

A first output node 35 at one end of the first transmission line 96a is electrically connected to the first output lead 39a. A second output node 36 at another end of the first transmission line 96a is electrically connected to the second terminal 20 via the additional output transmission line 19. A fourth output node 38 at one end of the second transmission line 96b is electrically connected to the second output lead 56a. A third output node 37 at another end of the second output transmission line 96b is electrically connected to the second terminal 20 via the additional output transmission line 19.

A fifth node 45 at one end of the third output transmission line 97 is electrically connected to the second terminal 20 via the additional transmission line 19. A sixth node 46b at another end of the third output transmission line 97 is electrically connected to the third output lead 46a.

Figure 4B:
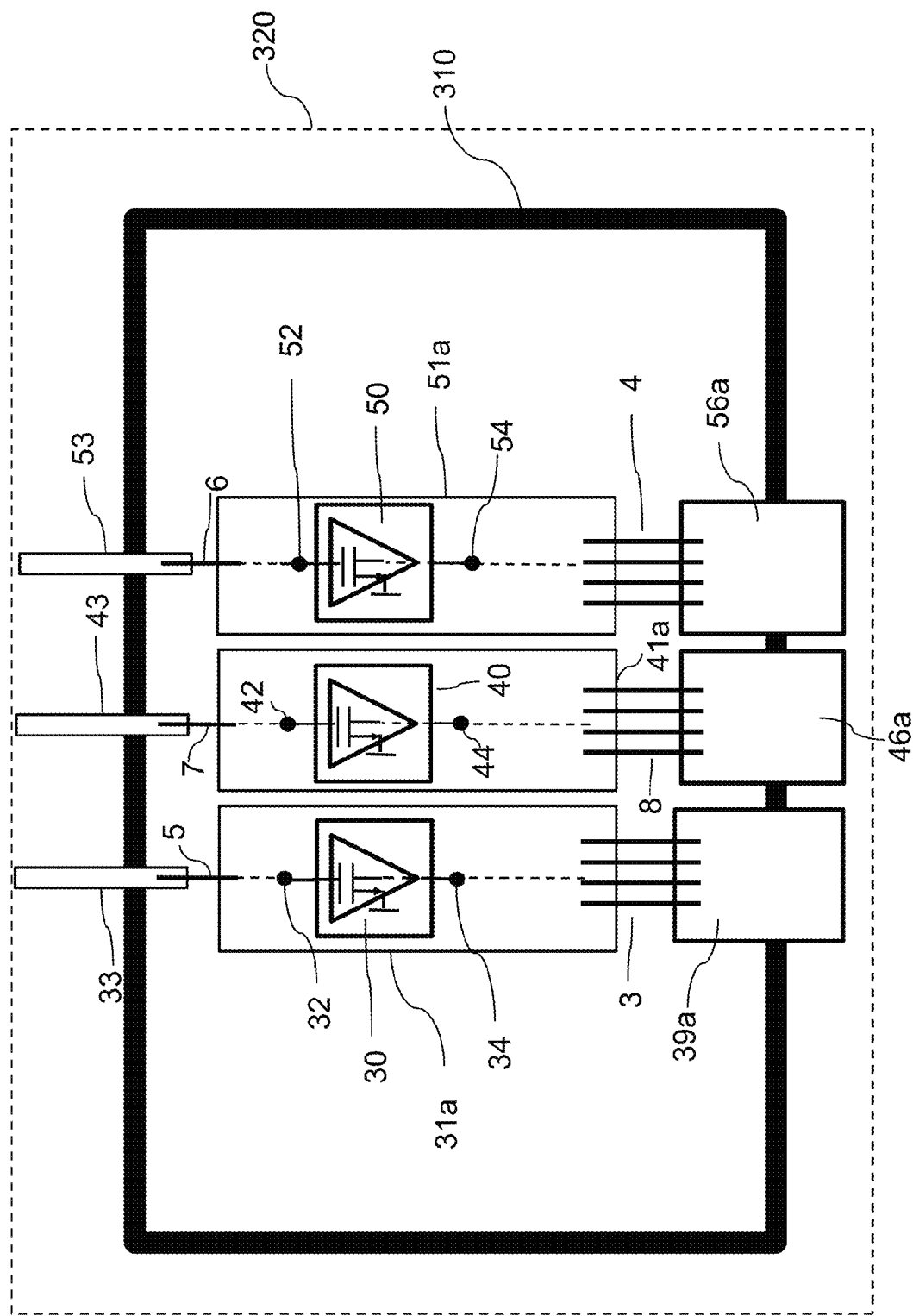
FIG. 4b shows a top view of a radio frequency power amplifier package, suitable for the example of FIG. 4a, FIG. 5 schematically shows an equivalent circuit of an input power splitter, FIG. 6 schematically shows an equivalent circuit of another input power splitter, FIG. 7 schematically shows an equivalent circuit of an output power combiner.

FIG. 4b shows in more details the RF power amplifier package 320 and its relative connections to the three amplifier stages 30, 50 and 40.

Referring to FIG. 4b the RF power amplifier package 320 may comprise a supporting means 310 on which three semiconductor active dies 31a, 51a and 41a are mounted or attached. A first semiconductor active die 31a comprises the first amplifier stage 30. A second semiconductor active die 51a comprises the second amplifier stage 50. The third semiconductor active die 41a comprises the third amplifier stage 40. Each amplifier stage 30, 50 and 40 may comprises a respective power transistor (schematically drawn in FIG. 4b with the symbol of a MOSFET). The respective power transistors may be of equal areas, and the three semiconductor active dies 31a, 51a and 41a may be of equal size. Alternatively, the respective power transistors of the first and second amplifier stages 30 and 50 may be of equal area, and the respective first and second semiconductor active dies 31a and 51a be of the same size, but different from the third amplifier stage 40 and the third semiconductor active die 41a.

As shown, the first, second and third semiconductor active dies 31a, 41a and 51a are arranged in an array, in this example a single row of an odd number of elements which is symmetric relative to the third semiconductor die 41a in the middle of the row. More specifically, the third semiconductor active die 41a is arranged between the first semiconductor active die 31a and the second semiconductor active die 31a. The arrangement of FIG. 4a and FIG. 4b is thus symmetric with respect to the third semiconductor active die 41a. This symmetry facilitates the design of the RF power amplifier circuit 120 and reduces variations of the electrical length of the input and output transmission lines 72a, 72b, 96a, 96b, 97 shown in FIG. 4a, and of the bondwires 2, 3, 4, 5, 6, 7 and 8, shown in FIGS. 4a-4b, against process variations.

One or more bondwires may couple the input leads 33, 53 and 43 to the respective inputs 32, 52, and 42.

The first input 32 is electrically coupled to the first input lead 33 via a first input bondwire 5. The second input 52 is electrically coupled to the second input lead 53 via a second input bondwire 6. The third input 42 is electrically coupled to the third input lead 43 via a third input bondwire 7.

One or more bondwires may couple the output leads 39a, 56a and 46a to the respective outputs 34, 54 and 44.

The first output 34 is electrically coupled to the first output lead 39a via a first set of bondwires 3. The second output 54 is electrically coupled to the second output lead 56a via a second set of bondwires 4. The third output 44 is electrically coupled to the third output lead 46a via a third set of bondwires 8.

The input power splitter may be implemented in any manner suitable for the specific implementation.

FIG. 5 shows for example an input power splitter 70a which has extra components compared to the input power splitter 70 shown in FIG. 1 and FIG. 2a. Components already described with reference to both FIG. 1 and FIG. 2 will not be described.

The input power splitter 70a comprises, additionally to the input power splitter 70, a third input transmission line 72c and a fourth input transmission line 72d. The third input transmission line 72c is arranged between the splitter input terminal 12 and the first node 80. The fourth input transmission line 72d is arranged between the splitter input terminal 12 and the fourth node 83. In this example, the splitter input terminal 12 is not directly connected to the first terminal 84 of the first capacitive element 74. The splitter input terminal 12 may be electrically connected to the first terminal 84 via the first input transmission line 72a and the third input transmission line 72c. The first input transmission line 72a and the third input transmission line 72c are connected together at the first node 80. The splitter input terminal 12 may be electrically connected to the first terminal 84 via the first second transmission line 72b and the fourth input transmission line 72d. The second input transmission line 72b and the fourth input transmission line 72d are connected together at the fourth node 83.

FIG. 6 shows another example of a different input power splitter. The input power splitter 73 comprises instead of a capacitor as in the example of FIGS. 1 and 2a, a varactor diode 85 as electrical reactive element connected at a first terminal 84b. The second input node 81 and the third input node 82 are both electrically connected to the first terminal 84b of the varactor diode 85. A second terminal 75 of the varactor diode may be coupled to the third input 42 (not shown in FIG. 6).

The varactor diode 85 has an internal capacitance that may be controlled by an external envelope signal. The external envelope signal may be generated by an envelope signal generator 210 and applied via a biasing inductor 110, connected in this example to the input terminal 10, to the varactor diode 85. The internal capacitance may be controlled for linearizing the RF power amplifier circuit 100 when it may be desired. Control of the internal capacitance of the varactor diode 85 via the biasing inductor 110 may provide a simple, thus also a cheap, solution for enhancing the linearity of the RF power amplifier circuit 100 when RF power amplifier circuit 100 is arranged, in operation, as a Doherty amplifier. The varactor diode 85 may provide the double function of determining the respective power fraction of the input power received by the three amplifier stages 30, 50 and 40 at the respective inputs 33, 52 and 42, and of enhancing the linearity of the Doherty amplifier. Typically, complex digital pre-distortion techniques are used to enhance the linearity of Doherty amplifiers. However, such complex digital pre-distortion techniques consume typically high amount of energy. The solution proposed in FIG. 6 may provide a solution aiming at enhancing the linearity of Doherty amplifiers, which may be more cost-effective and may consume less energy than the prior-art complex digital pre-distortion techniques.

Referring to FIG. 7 the output power combiner 99 shown in therein may be fully integrated in the RF power amplifier package 300, with for example bondwires, and capacitors integrated in one or more of the semiconductor active dies 31, 51 or 41.

The output power combiner 99 comprises a first network and a second network of inductors and capacitors. The first network comprises a first series inductor 92, a first shunt capacitor 96 and a second series inductor 93. The second network comprises a third series inductor 94, a second shunt capacitor 97 and a third series inductor 94. The first network and the second network are electrically connected in series at terminal 45, e.g. the second series inductor 93 is connected in series with the third series inductor 94 at the terminal 45. The terminal 45 is electrically connected to the third input 44.

The first output node 35 and the fourth output node 38 may be electrically coupled, as shown in FIG. 1, to the output terminal 20 through the respective first output lead 39 and second output lead 56 of the RF power amplifier package 300 and through for example the associated set of bondwires The output power combiner 99 is implemented as a so-called double pi LC network. The output power combiner may be implemented as a single pi LC network. The output power combiner 99 may be used in combination with the input power splitter 70, 70a, 71 or 73 to achieve a relative bandwidth of the RF power amplifier circuit 100 higher than for example a relative bandwidth obtained with a single pi LC network. For example with the double pi LC network above described, a relative bandwidth of up to 45% can be achieved. However, more than two LC networks in series may be used to achieve even higher relative bandwidth.

It should be also understood that the output power combiner 99 may be fully integrated in the RF power amplifier package 300, in which case parasitic components such as the set of bondwires 3 or 4 and parasitic shunt capacitors of the output leads 39 and 56 (shown in the FIGS. 1 to 2b) with reference to ground may be excluded from the output power combiner 99, and hence their influence on the bandwidth characteristics of RF power amplifier circuit 100 reduced.

Figure 8:
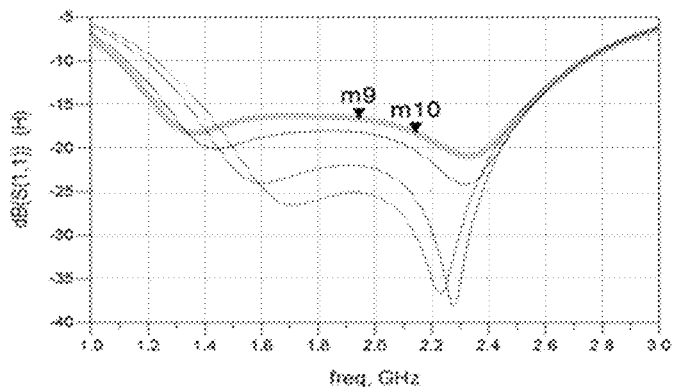
FIG. 8 shows a graph of the return loss versus frequency at the input terminal of a radio frequency power amplifier circuit.

FIG. 8 shows the return loss, e.g. the scattering parameter S(1,1) at the input terminal 10 of the RF power amplifier circuit 100 versus several different values of the first capacitive element 74 in a range between 2.4 pF and 3.3 pF.

FIG. 8 shows that the return loss can be relatively low, e.g. below −15 dB, for a relatively large frequency range, e.g. between 1.2 GHz and 2.5 GHz. As a consequence the relative bandwidth of the RF power amplifier circuit 100 can be enhanced by controlling the value of the first capacitive element 74.

The thicker line in FIG. 8 is a calculated value of the scattering parameter for a specific value of the capacitive element 74 within the range between 2.4 pF and 3.3 pF. The specific value of the capacitive element 74 may be a value suitable for the specific implementation.

Figure 9:
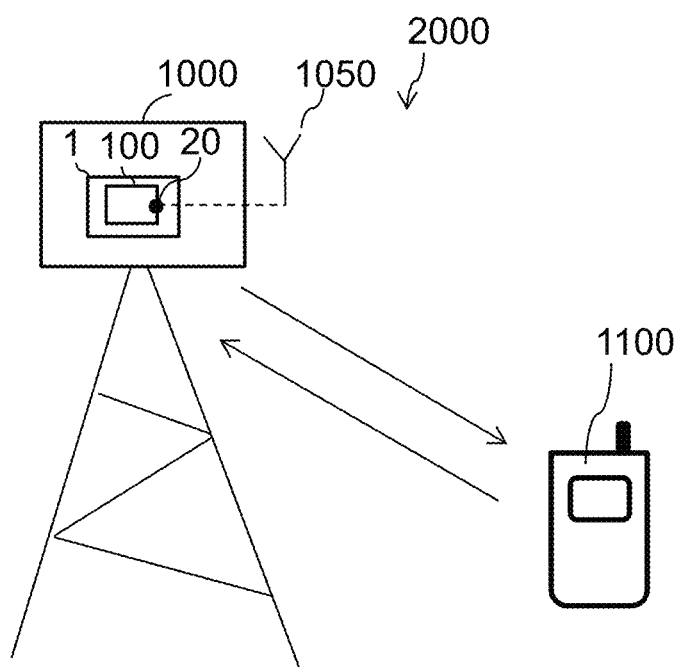
FIG. 9 shows a communication system.

FIG. 9 shows a communications system 2000. The communications system 2000 may be a communications system suitable for wireless transmission. The communications system 2000 comprises a base station 1000 and one or more mobile devices 1100, such as for example a mobile phone. The communications system 2000 is arranged to provide wireless transmission of a signal to one or more of the mobile devices 1100. The base station 1000 comprises a transmitter 1 comprising an RF power amplifier circuit according to an embodiment, such as RF power amplifier circuit 100 described above with reference to FIG. 1 and FIGS. 2a-2b or the RF power amplifier circuit 120 described above with reference to FIG. 3 and FIGS. 4a-4b. The RF power amplifier circuit 100 or 120 is arranged to provide an output RF signal at a radio frequency. The output RF signal may be modulated for example in phase, amplitude or frequency for down-link transmission to at least one of the mobile devices 1100 s. The base station 1000 may comprise the transmitter 1 comprising the RF power amplifier circuit 100 or 120, and an antenna 1050 electrically coupled to the output terminal 20 for transmitting the output RF signal through a communication channel.

In the foregoing specification, the invention has been described with reference to specific examples of embodiments of the invention. It will, however, be evident that various modifications and changes may be made therein without departing from the scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

Furthermore, in place of the varactor diode 85 any other type of suitable electronically controlled capacitor or varicap can be used.

The semiconductor active dies 31, 51, 41 or 31a, 51a, 41a as well the respective power transistors of the respective power amplifier stages 30, 50 and 40 described herein can be manufactured by using any suitable semiconductor technology. The semiconductor technology may be one of the group consisting of: gallium arsenide, gallium nitride, silicon germanium, lateral diffused metal oxide semiconductor (LDMOS), silicon-on-insulator (SOI), silicon, monocrystalline silicon, silicon on carbide and the like, and combinations of the above.

The respective power transistors may for example one of the group of transistors consisting of: a field effect transistor, a high electron mobility transistor, a bipolar transistor, and a heterojunction bipolar transistor.

The electrical conductive connections as discussed herein may be illustrated or described in reference to being a single conductor, or a plurality of conductors. For example, in FIGS. 2b and 4b single bondwires 5, 6, and 7 are used to connect the input leads 33, 53 and 43 to the respective inputs 32, 52 and 42. However a plurality of bondwires may be used. Similarly one or more input lead or one or more output lead can be used for each electrical connection between RF power amplifier package 300 or 320 and the respective input power splitter 70, 70a, 71 or 73 and/or the respective output power combiner 91, 92 or 99. Therefore, many options exist for transferring signals.

Because the RF power amplifier circuit 100 or 120 implementing the present invention is, for the most part, composed of electronic components such as transmission lines, capacitors and/or inductors and circuits known to those skilled in the art, circuit details have not been explained in any greater extent than that considered necessary, for the understanding and appreciation of the underlying concepts of the present invention and in order not to obfuscate or distract from the teachings of the present invention.

Also, devices functionally forming separate devices may be integrated in a single physical device. Also, the units and circuits may be suitably combined in one or more semiconductor devices. For example, the input transmission lines 72a and 72b and the first capacitive element 74, or the input transmission line 72a and 72b and the first and second capacitive element 76 and 78 may be integrated in a separated die of a suitable semiconductor technology capable to integrate passive components. The separated die may be mounted on the PCB 150. Similarly the output transmission lines 96a and 96b can be integrated in another separated die of, for example, the same or different suitable semiconductor technology and included inside or outside the RF power amplifier package 300 or 320.

The RF power amplifier package 300 or 320 may be connected to these separated dies with bondwires or other electrical conductive connections.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A radio frequency power amplifier circuit having an input terminal for receiving an input signal having an input power, and an output terminal for outputting an output signal having an output power larger than the input power, the radio frequency power amplifier circuit comprising:
   a first amplifier stage having a first input and a first output, a second amplifier stage having a second input and a second output, and a third amplifier stage having a third input and a third output, the respective first input, second input and third input being arranged to receive respective power fraction signals having respective power fractions of the input power, and the respective first output, second output and third output being electrically coupled to the output terminal for outputting respective output signals, and,
   an input power splitter for providing the respective power fraction signals having the respective power fractions of the input power to the first, second and third inputs, the input power splitter comprising:
      a splitter input terminal electrically connected to the input terminal for receiving the input signal from the input terminal,
      a first input transmission line arranged between a first node and a second node and a second input transmission line arranged between a third node and a fourth node, and
      an electrical reactive element having a first terminal electrically connected to both the second node and to the third node, and having a second terminal electrically coupled to the third input,
   the first node and the fourth node being electrically coupled to the first input and the second input, respectively, and the splitter input terminal being electrically coupled to the first terminal.

2. A radio frequency amplifier circuit as claimed in claim 1, the first amplifier stage, the second amplifier stage and the third amplifier stage being arranged in respective areas of a supporting means, and the third amplifier stage being located between the first amplifier stage and the second amplifier stage.

3. A radio frequency amplifier circuit as claimed in claim 1, the first amplifier stage, the second amplifier stage and the third amplifier stage being integrated in a power amplifier package having at least a first input lead electrically coupled to the first input, a second input lead electrically coupled to the second input and a third input lead electrically coupled to the third input, and the input power splitter being arranged outside the power amplifier package.

4. A radio frequency power amplifier circuit as claimed in claim 1, the first amplifier stage comprising a first power transistor having a first area, the second amplifier stage comprising a second power transistor having a second area substantially equal to the first area.

5. A radio frequency power amplifier circuit as claimed in claim 4, the first power transistor being one of the group of transistors consisting of: a field effect transistor, a high electron mobility transistor, a bipolar transistor, and a heterojunction bipolar transistor being manufactured in one of the group of semiconductor technologies consisting of: silicon, gallium arsenide, gallium nitride, lateral diffused metal oxide semiconductor, metal oxide semiconductor, silicon on carbide and silicon on insulator and a combination thereof.

6. A radio frequency power amplifier circuit as claimed in claim 1, the first input transmission line has a first input electrical length and the second input transmission line having a second input electrical length substantially equivalent to the first input electrical length.

7. A radio frequency power amplifier circuit as claimed in claim 1, further comprising an output power combiner for combining said respective output signals into the output signal at the output terminal, the output power combiner comprising:
   a first output transmission line arranged between a first output node and a second output node, and
   a second output transmission line arranged between a third output node and a fourth output node,
   the first output node being electrically coupled to the respective first output, the fourth output node being electrically coupled to the respective second output, and both second output node and third output node being both electrically coupled to the third output.

8. A radio frequency power amplifier circuit as claimed in claim 7, the first output transmission line having a first output electrical length and the second output transmission line having a second output electrical length substantially equivalent to the first output electrical length.

9. A radio frequency power amplifier circuit as claimed in claim 7, wherein the output power combiner further comprising a third output transmission line arranged between the third output and a fifth output node, the fifth output node being electrically connected to both the second output node and the third output node, and to the output terminal.

10. A radio frequency power amplifier circuit according to claim 7, the first output transmission line being formed by a first network comprising a first series inductor, a first shunt capacitor and a second series inductor, and the second output transmission line being formed by a second network comprising a third series inductor, a second shunt capacitor, and a fourth series inductor, the first network and the second network being electrically connected in series at both the second output node and third output node.

11. A radio frequency power amplifier circuit as claimed in claim 1, the electrical reactive element having a predetermined value for:
   inputting a first power fraction signal to the first input of the first amplifier stage, the first power fraction signal having a first power fraction of the input power, and a second power fraction signal to the second input of the second amplifier stage, the second power fraction signal having a second power fraction equal to the first power fraction, and
   inputting a third power fraction signal to the third input of the third amplifier stage, the third power fraction signal having a third power fraction of the input power.

12. A radio frequency power amplifier circuit as claimed in claim 11, and capable for being operated as a radio frequency Doherty amplifier, the first amplifier stage and the second amplifier stage being a peak amplifier stage, the third amplifier stage being a main amplifier stage, and the first power fraction being higher than the third power fraction.

13. A radio frequency power amplifier circuit as claimed in claim 11, and capable for being operated as a class AB radio frequency power amplifier, the first power fraction being equivalent to the third power fraction.

14. A radio frequency base station for mobile communications, comprising:
   a transmitter comprising the radio frequency power amplifier circuit as claimed in claim 1, and
   an antenna electrically coupled to the output terminal of the radio frequency amplifier circuit for transmitting the output signal through a communication channel.

15. A communications system comprising a radio frequency base station according to claim 14 and one or more mobile devices, the radio frequency base station being arranged to provide wireless transmission to one or more of the mobile devices.

16. The radio frequency power amplifier circuit as claimed in claim 1, wherein the electrical reactive element has an electrical reactive element value configured to provide a third respective power fraction of the respective power fractions to the third input, wherein the third respective power fraction is less than a first respective power fraction of the respective power fractions provided to the first input and is also less than a second respective power fraction of the respective power fractions provided to the second input.

17. The radio frequency power amplifier circuit as claimed in claim 1, wherein the electrical reactive element has an electrical reactive element value, the electrical reactive element value providing selection of operation of the radio frequency power amplifier circuit among a group consisting of operation as a Doherty amplifier and operation as a class AB amplifier.

18. A radio frequency power amplifier circuit having an input terminal for receiving an input signal having an input power, and an output terminal for outputting an output signal having an output power larger than the input power, the radio frequency power amplifier circuit comprising:
   a first amplifier stage having a first input and a first output, a second amplifier stage having a second input and a second output, and a third amplifier stage having a third input and a third output, the respective first input, second input and third input being arranged to receive respective power fraction signals having respective power fractions of the input power, and the respective first output, second output and third output being electrically coupled to the output terminal for outputting respective output signals; and
   an input power splitter for providing the respective power fraction signals having the respective power fractions of the input power to the first, second and third inputs, the input power splitter comprising:
      a splitter input terminal electrically connected to the input terminal for receiving the input signal from the input terminal;
      a first input transmission line arranged between a first node and a second node and a second input transmission line arranged between a third node and a fourth node;
      an electrical reactive element having a first terminal electrically connected to both the second node and to the third node, and having a second terminal electrically coupled to the third input,
         the first node and the fourth node being electrically coupled to the first input and the second input, respectively, and the splitter input terminal being electrically coupled to the first terminal;
      a third input transmission line arranged between the splitter input terminal and the first node; and
      a fourth input transmission line arranged between the splitter input terminal and the fourth node,
         for electrically connecting the splitter input terminal to the first terminal via the first input transmission line and the third transmission line, and via the second transmission line and the fourth transmission line.

19. A radio frequency power amplifier circuit having an input terminal for receiving an input signal having an input power, and an output terminal for outputting an output signal having an output power larger than the input power, the radio frequency power amplifier circuit comprising:
   a first amplifier stage having a first input and a first output, a second amplifier stage having a second input and a second output, and a third amplifier stage having a third input and a third output, the respective first input, second input and third input being arranged to receive respective power fraction signals having respective power fractions of the input power, and the respective first output, second output and third output being electrically coupled to the output terminal for outputting respective output signals; and
   an input power splitter for providing the respective power fraction signals having the respective power fractions of the input power to the first, second and third inputs, the input power splitter comprising:

a splitter input terminal electrically connected to the input terminal for receiving the input signal from the input terminal, a first input transmission line arranged between a first node and a second node and a second input transmission line arranged between a third node and a fourth node, and an electrical reactive element having a first terminal electrically connected to both the second node and to the third node, and having a second terminal electrically coupled to the third input, the electrical reactive element being a variable reactance diode, the first node and the fourth node being electrically coupled to the first input and the second input, respectively, and the splitter input terminal being electrically coupled to the first terminal.

20. A radio frequency power amplifier circuit as claimed in claim 19, further comprising a second capacitive element having a third terminal electrically connected to the first node and a fourth terminal electrically coupled to the first input and a third capacitive element having a fifth terminal electrically connected to the fourth node and a sixth terminal electrically coupled to the second input.

\* \* \* \* \*